United States Patent
Conley, Jr. et al.

(10) Patent No.: US 7,473,640 B2
(45) Date of Patent: *Jan. 6, 2009

(54) REACTIVE GATE ELECTRODE CONDUCTIVE BARRIER

(75) Inventors: John F. Conley, Jr., Camas, WA (US); Yoshi Ono, Camas, WA (US); Wei Gao, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 592 days.

This patent is subject to a terminal disclaimer.

(21) Appl. No.: 10/784,662

(22) Filed: Feb. 23, 2004

(65) Prior Publication Data

US 2004/0164362 A1    Aug. 26, 2004

Related U.S. Application Data

(63) Continuation-in-part of application No. 10/345,744, filed on Jan. 15, 2003, now Pat. No. 6,861,712.

(51) Int. Cl.
*H01L 29/72* (2006.01)

(52) U.S. Cl. .......... 438/653; 438/157; 438/176; 438/197; 438/216; 438/283; 438/686; 257/369; 257/407

(58) Field of Classification Search .......... 438/183, 438/184, 586, 653, 645, 157, 176, 197, 216, 438/283, 686; 257/407, 369
See application file for complete search history.

(56) References Cited

U.S. PATENT DOCUMENTS

| | | | |
|---|---|---|---|
| 6,573,149 B2 * | 6/2003 | Kizilyalli et al. | 438/383 |
| 6,861,712 B2 * | 3/2005 | Gao et al. | 257/369 |
| 2002/0142531 A1 * | 10/2002 | Hsu et al. | 438/183 |
| 2003/0146479 A1 * | 8/2003 | Barnak et al. | 257/412 |
| 2003/0151074 A1 * | 8/2003 | Zheng et al. | 257/200 |
| 2004/0106249 A1 * | 6/2004 | Huotari | 438/216 |
| 2004/0175910 A1 * | 9/2004 | Pan et al. | 438/592 |

OTHER PUBLICATIONS

V. Misra, G.P. Heuss, H. Zhong, "Use of metal-oxide-semiconductor capacitors to detect interactions of Hf and Zr gate electrodes with $SiO_2$ and $ZrO_2$," Appl. Phys. Lett. 78, 4166 (2001).

(Continued)

*Primary Examiner*—Edward Wojciechowicz
(74) *Attorney, Agent, or Firm*—Law Office of Gerald Maliszewski; Gerald Maliszewski

(57) ABSTRACT

A method, and corresponding transistor structure are provided for protecting the gate electrode from an underlying gate insulator. The method comprises: forming a gate insulator overlying a channel region; forming a first metal barrier overlying the gate insulator, having a thickness of less than 5 nanometers (nm); forming a second metal gate electrode overlying the first metal barrier, having a thickness of greater than 10 nm; and, establishing a gate electrode work function exclusively responsive to the second metal. The second metal gate electrode can be one of the following materials: elementary metals such as p+ poly, n+ poly, Ta, W, Re, $RuO_2$, Pt, Ti, Hf, Zr, Cu, V, Ir, Ni, Mn, Co, NbO, Pd, Mo, TaSiN, and Nb, and binary metals such as WN, TaN, and TiN. The first metal barrier can be a binary metal, such as TaN, TiN, or WN.

13 Claims, 1 Drawing Sheet

OTHER PUBLICATIONS

V. Misra, M. Kulkarni, G. Heuss, H. Zhong, and H. Lazar, "*Electrical amd Material Properties of Metal Silicate Dielectrics and Metal Gate Electrodes for Advanced CMOS Devices*," in Electrochemical Society Proceedings vol. 2000-9, p. 291-98 (2000).

\* cited by examiner

REACTIVE GATE ELECTRODE CONDUCTIVE BARRIER

RELATED APPLICATIONS

This application is a continuation-in-part of an application entitled, MOSFET THRESHOLD VOLTAGE TUNING WITH METAL GATE STACK CONTROL, invented by Gao et al., filed Jan. 15, 2003, Ser. No. 10/345,744 now U.S. Pat. No. 6,861,712.

BACKGROUND OF THE INVENTION

1. Field of the Invention

This invention generally relates to CMOS fabrication processes and, more particularly, to a CMOS device that uses a stacked metal structure, with a metal barrier to protect a metal gate electrode, that does not affect the gate electrode work function.

2. Description of the Related Art

The threshold voltages ($V_{th}$) of the NMOS and PMOS components in a complementary metal oxide semiconductor (CMOS) circuit largely dictate the speed, standby current, and operating current performance characteristics. The $V_{th}$ must be set to maximize the "on" current, while minimizing the "off" current. Usually this is a trade off that is determined by the circuit design and application. Typically, the $V_{th}$ is adjusted through fine-tuning of the doping level in the channel region of the transistors with a $V_{th}$ adjust implant. As the feature size of transistors continues to scale down, the struggle to minimize short channel effects, and reduce punch-through and drain-induced barrier lowering with implantations and anneals, ultimately limit the device speed.

As an alternative method of adjusting $V_{th}$, the work function of the gate can be controlled. This is usually done with implants into the gate polysilicon, where donor type dopant is placed in the gate for NMOS, and acceptor dopants into PMOS gates. The use of doped polysilicon gates presents a different set of problems, however. Dopant diffusion, through the gate dielectric into the channel, affects the $V_{th}$, polysilicon depletion near the gate dielectric, and limits the performance of the transistors.

Doped polysilicon has been the gate material of choice for the last several generations of microelectronics technology. To achieve low $V_{th}$ devices (required for high performance), p+ poly is used for PMOS and n+ poly is used for NMOS. As devices are scaled, the thickness of the poly-Si gate is decreased. In order to maintain low sheet resistance and a large effective oxide capacitance (i.e. minimize poly depletion effects) it has been necessary to increase the poly doping density with each successive generation. This has led to the problem of channel autodoping in which boron (B) from the gate poly diffuses across the thin gate dielectric and into the channel, causing $V_{th}$ variations that degrade device performance.

This diffusion, or autodoping problem is addressed with the use of metal gate materials. With metal gate technologies, the choice of an appropriate work function material is necessary for the N and P MOSFETs. The work function is the energy required to remove an electron from the Fermi level to vacuum. The work function of different materials, and different metals, varies. Since the NMOS and PMOS work function requirements are different, the metal materials are typically different. Thus, dual metals, with work functions corresponding to p+ and n+ poly Si) will be required for CMOS circuits.

However, the use of completely different metal materials for NMOS and PMOS gates results in additional fabrication steps and undesired complexity.

It has been shown that many of the desirable gate metal materials have adhesion and/or stability problems when placed in direct contact with the $SiO_2$ or high k gate dielectrics, such as $HfO_2$ or $ZrO_2$. For example, it is known that Pt does not adhere well to $SiO_2$, and metals such as Ti, Hf, or Zr, scavenge O, reducing the underlying dielectric film, causing degradation and increased leakage.

It would be advantageous if the above-mention diffusion and adhesion problems could be addressed using a gate electrode diffusion barrier.

It would be advantageous if a gate electrode diffusion barrier could be used that didn't contribute to the work function of a metal gate electrode.

It would be advantageous if a gate electrode diffusion barrier were conductive, so that it did not contribute to the capacitance of the gate stack.

SUMMARY OF THE INVENTION

As noted above, metal gates are needed in MOS fabrication processes. Conventionally, metals are placed in direct contact with the gate dielectric, such as SiO2 or high-k dielectrics. The direct contact of the gate electrode metal and gate dielectric can result in adhesion and stability issues, as the reactivity of metal with the dielectric may lead to oxygen scavenging.

The present invention discloses the use of a thin interfacial layer or barrier that improves adhesion between a metal gate and an underlying dielectric. The layer also serves as a barrier metal to reduce reactivity. As long as the thickness of this interfacial metal is small, it does not impact Vth of the transistor. Because the barrier/layer is a metal, gate resistivity and capacitance are not adversely impacted.

Accordingly, a method is provided for protecting the gate electrode from an underlying gate insulator. The method comprises: forming a gate insulator overlying a channel region; forming a first metal barrier overlying the gate insulator, having a thickness of less than 5 nanometers (nm); forming a second metal gate electrode overlying the first metal barrier, having a thickness of greater than 10 nm; and, establishing a gate electrode work function exclusively responsive to the second metal.

The second metal gate electrode can be one of the following materials: elementary metals such as p+ poly, n+ poly, Ta, W, Re, RuO2, Pt, Ti, Hf, Zr, Cu, V, Ir, Ni, Mn, Co, NbO, Pd, Mo, TaSiN, or Nb, and binary metals such as WN, TaN, or TiN. The second metal gate electrode can have either a high or low work function, depending upon the choice of gate electrode metal. The gate insulator can one of the following materials: SiO2 and high-k dielectrics such as HfO2, ZrO2, Al2O3, La2O3, HfAlOx, or HfAlON, and binary, ternary, or nitrided metal oxides. The first metal barrier can be a binary metal, such as TaN, TiN, or WN.

The first barrier metal prevents the migration of oxygen from the gate insulator to the second metal gate electrode. If the gate electrode is a p+ poly material, the first barrier metal can prevent the migration of B into the gate insulator, from the p+ poly gate electrode.

Additional details of the above-described method and a MOSFET transistor with a reactive metal gate electrode barrier, are explained below.

DETAILED DESCRIPTION OF THE PREFERRED EMBODIMENTS

Figure 1:
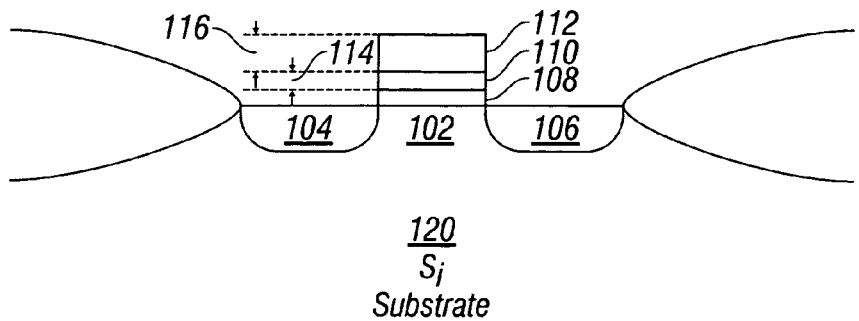
FIG. 1 is a partial cross-sectional view of the present invention MOSFET transistor with a reactive metal gate electrode barrier.

FIG. 1 is a partial cross-sectional view of the present invention MOSFET transistor with a reactive metal gate electrode barrier. The transistor 100 comprises a channel region 102. Also shown are a source 104 and drain 106. A gate insulator 108 overlies the channel region 102. A first metal barrier 110 overlies the gate insulator 108. A second metal gate electrode 112 overlies the first metal barrier 110. The second metal gate electrode 112 has a gate electrode work function exclusively responsive to the second metal 112. That is, the first metal barrier 110, despite being a metal, or metal-like material, does not contribute to, or impact the gate work function.

Beneficially, the first barrier metal 110 prevents the migration of oxygen from the gate insulator 108 to the second metal gate electrode 112. The first barrier metal 110 also prevents the migration of materials from the gate electrode 112, into the gate insulator 108. For example, if a p+ poly gate electrode 112 is used, the first barrier metal 110 prevents the migration of B into the gate insulator 108 from a p+ poly gate electrode 112. Likewise, the first metal barrier 110 prevents the migration of dopants if an n+ poly gate electrode is formed.

The first metal barrier 110 has a thickness 114 of less than about 5 nanometers (nm) and the second metal gate electrode has a thickness 116 of greater than about 10 nm. In some aspects, the first metal barrier 110 has a thickness 114 of greater than 1.5 nm, and less than 5 nm. It should be noted that as the second metal thickness 116 increases, the effect of the first metal thickness 114 becomes less significant in the determination of work function. As is understood by those skilled in the art, the transistor 100 has a threshold voltage ($V_{th}$) responsive to the second metal gate electrode 112 work function. The threshold voltage may also be responsive to the thickness of dielectric 108 and the doping of underlying silicon substrate 120.

The second metal gate electrode 112 can be formed from elementary metals such as W, Ta, Re, RuO2, p+ poly, n+ poly, Pt, Ti, Hf, Zr, Cu, V, Ir, Ni, Mn, Co, NbO, Pd, Mo, TaSiN, or Nb. Although p+ and n+ poly are not actually elementary metals, they have been included in this category because they have characteristics of an elementary metal. Further, binary metals such as WN, TaN, or TiN can be used as the second metal gate electrode 112.

The gate insulator 108 can be either SiO2 or a high-k dielectrics such as HfO2, ZrO2, Al2O3, La2O3, HfAlOx, or HfAlON. Further, binary, ternary, or nitrided metal oxides can be used as the gate insulator 108. The first metal barrier 110 can be a binary metal, such as TaN, TiN, or WN. It should be noted that these first metal materials can also be used as a second metal gate electrode in some aspects. Depending on the binary metal stoichiometry, in this case the amount of N added, the binary metal work function can be made to vary. When used with second metal materials, the thickness of the first metal material, regardless of the stoichiometry, prevents a contribution to the gate electrode 112 work function.

More specifically, if the second metal gate electrode 112 has a high work function, then following materials may be used: elemental metals such as Ir, Pt, Cu, Re, Co, Ni, Mn, RuO2, p+ poly, Pd, Mo, or TaSiN. Further, binary metals such as TaN, WN, or TiN may be used. A high work function is about 5eV, +/– a few tenths of an eV.

If the second metal gate electrode 112 has a low work function, then the following materials may be used: elementary metals such as Al, Nb, Hf, Zr, V, Ir, n+ poly, W, Ti, NbO, or Ta. Further, binary metals such as TaN, TiN, or WN may be used. Low work function metals are generally reactive, and the use of the first metal barrier with reactive gate electrode materials is especially beneficial. A low work function is generally about 4eV, +/–0.2 eV.

The first metal barrier 110 and the second metal gate electrode are non-diffused metals. As used herein, the term "non-diffused" is intended to mean that the two metal layers are not intentionally diffused by an annealing process, for example, an annealing process that ensures that the two metals are fully mixed—reaching an equilibrium state. Generally speaking, metals do diffuse when they contact. However in some circumstance, like with a compound/metal such as TiN/Pt is used, an insignificant amount of diffusion may occur. Overlying metals with an insignificant amount of diffusion are still considered to be non-diffused. Alternately stated, when metal combinations such as Ti/Pt are used, where a small degree of diffusion is inevitable, this partial diffusion does not contradict the more general non-diffused state of the metals.

Functional Description

As noted above, the present invention uses a thin interfacial (first metal) layer, or barrier to improve adhesion between a metal gate and an underlying dielectric, and to serve as a barrier metal to reduce reactivity. A key element is that a thin interfacial metal does not impact $V_{th}$ of the transistor. Because the barrier/layer is a metal, gate resistivity and capacitance are not adversely impacted.

Figure 2:
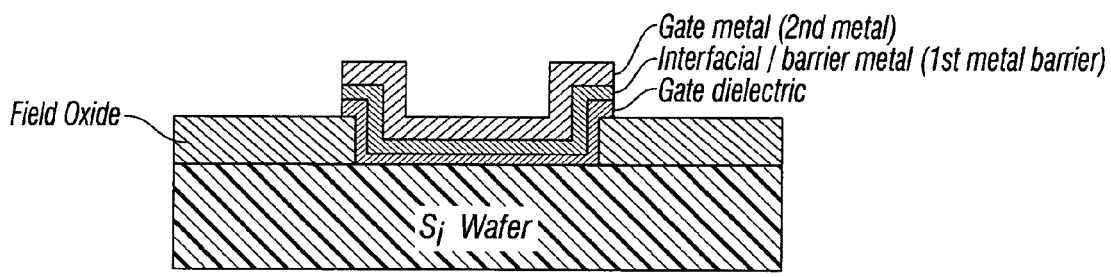
FIG. 2 is a partial cross-sectional view of a step in the fabrication of the present invention transistor of FIG. 1.

FIG. 2 is a partial cross-sectional view of a step in the fabrication of the present invention transistor of FIG. 1. The structure, prior to depositing the first metal barrier layer, is formed by any state of the art method. FIG. 2 is an exemplary gate replacement process. However, the present invention is not limited to any particular gate formation process. A gate dielectric, of any kind, has been deposited or grown, and is ready for the metal gate.

A thin first metal barrier/interfacial layer of metal is deposited by any state of the art method. Depending on the structure, this metal material can be TiN, TaN or WN.

A (second) metal gate with the desired work function properties is then deposited to desired thickness by any state of the art method. Depending of the design of the structure, this film can be Pt, Ti, Hf, Zr, or any other potential metal or metal compound. The metal stack is then etched or chemical mechanically polished (CMP'd) to form the desired device structure. The structure can then be treated thermally, electrically, or mechanically, as required.

The first metal barrier improves adhesion and reduces any reaction between the overlying gate and the underlying dielectric. Because the interfacial layer is thin, typically less than 50 Å the work function of the transistor device is determined solely by the top (second) gate metal.

A gate stack consisting of any gate metal and any dielectric can be made compatible, providing a suitable barrier metal is used. In some aspects, if the work function of the gate metal is not an optimum value, the thickness of the first metal barrier can be adjusted, typically to a value greater than 90 Å, to shift the threshold voltage to the desired value.

Figure 3:
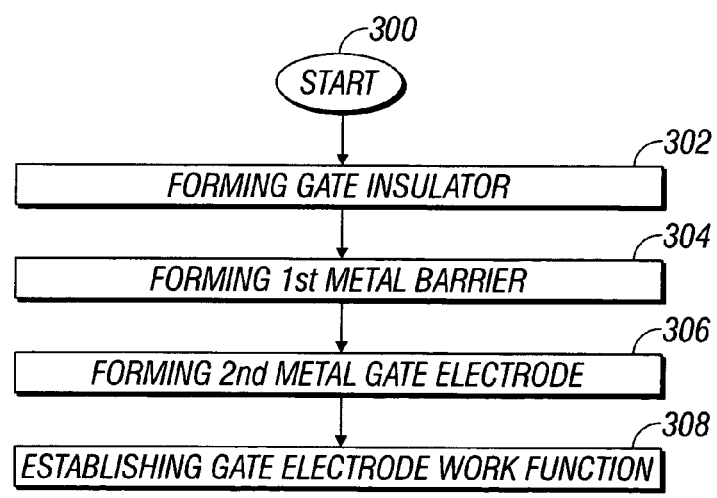
FIG. 3 is a flowchart illustrating the present invention method for protecting the gate electrode from an underlying gate insulator, in a MOSFET transistor with a reactive metal gate electrode.

FIG. 3 is a flowchart illustrating the present invention method for protecting the gate electrode from an underlying gate insulator, in a MOSFET transistor with a reactive metal gate electrode. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 300.

Step 302 forms a gate insulator overlying a channel region. Step 304 forms a first metal barrier overlying the gate insulator. Step 306 forms a second metal gate electrode overlying the first metal barrier. Step 308 establishes a gate electrode work function exclusively responsive to the second metal. In some aspects, Step 308 establishes a threshold voltage ($V_{th}$).

In some aspects of the method, forming a first metal barrier (Step 304) includes forming a first metal barrier having a thickness of less than about 5 nanometers (nm). Forming a second metal gate electrode (Step 306) includes forming a second metal gate electrode having a thickness of greater than about 10 nm. In other aspects, Step 304 forms a first metal barrier having a thickness of greater than 1.5 nm, and less than 5 nm.

Generally, forming a second metal gate electrode (Step 306) includes forming a second metal gate electrode from a material such as elementary metals including p+ poly, n+ poly, Ta, W, Re, RuO2, Pt, Ti, Hf, Zr, Cu, V, Ir, Ni, Mn, Co, NbO, Pd, Mo, TaSiN, or Nb, and binary metals including WN, TaN, or TiN. This is a list of commonly used materials, and it is not intended to be an exhaustive list of every possible materials. Other materials would be known by those skilled in the art.

Forming a gate insulator overlying a channel region (Step 302) includes forming a gate insulator from a material such as SiO2, high-k dielectrics such as HfO2, ZrO2, Al2O3, La2O3, HfAlOx, or HfAlON, and binary, ternary, or nitrided metal oxides. Forming a first metal barrier (Step 304) includes forming the first metal barrier from a binary metal such as TaN, TiN, or WN. Again, these are not intended to be exhaustive lists of every possible material that can be used.

If Step 306 forms a second metal gate electrode having a high work function, then the second metal may be elemental metals such as Ir, Pt, Cu, Re, Ni, Mn, Co, RuO2, p+ poly, Pd, Mo, or TaSiN, or a binary metal such as TaN, WN, or TiN. If Step 306 forms a second metal gate electrode having a low work function, then the second metal may be an elementary metals such as Al, Nb, Hf, Zr, V, Ir, n+ poly, W, Ti, Ta, or NbO, or a binary metal such as TaN, TiN, or WN.

In some aspects, forming a first barrier metal overlying the gate insulator in Step 304 includes the first metal barrier preventing the migration of oxygen from the gate insulator to the second metal gate electrode. In other aspects, Step 304 prevents the migration of B into the gate insulator from a p+ poly gate electrode.

Stacked metal gate MOSFET devices and associated fabrication processes have been presented above. For full CMOS applications, where the metal stack for the NMOSFET is different from the PMOSFET, the first metal layer is typically deposited over the entire wafer surface. Then, patterning and etching steps are performed. Since the first metal barrier is extremely thin, less than 5 nm, it can be etched easily by either a wet or dry process.

Examples have been given of various gate metals and first and second gate metal combinations. However, the invention is not limited to simply these examples. Further, examples have been given using only metal gate materials. The invention can also be enabled using other materials, or combinations of metals with other materials. For example, the first layer may be a metal and the second layer polysilicon. Other variations and embodiments of the invention will occur to those skilled in the art.

We claim:

1. In a MOSFET transistor with a reactive metal gate electrode, a method for protecting the gate electrode from an underlying gate insulator, the method comprising:
    forming a gate insulator overlying a channel region;
    forming a gate electrode including:
        a first metal layer, which is a barrier, overlying the gate insulator, having a thickness of less than 5 nanometers (nm); and,
        a second metal layer overlying the first metal layer;
    wherein the gate electrode has a work function exclusively responsive to a second metal layer,
    selected from a group consisting of Pt, NbO, Pd, and Nb.

2. The method of claim 1 wherein forming a gate electrode including a second metal layer includes forming a second metal layer having a thickness of greater than about 10 nm.

3. The method of claim 2 wherein forming a gate electrode including a first metal layer includes forming a first metal layer having a thickness of greater than 1.5 nm, and less than 5 nm.

4. The method of claim 1 wherein forming a gate insulator overlying a channel region includes forming a gate insulator from a material selected from the group consisting of SiO2, high-k dielectrics such as HfO2, ZrO2, Al2O3, La2O3, HfAlOx, and HfAlON, and binary, ternary, and nitrided metal oxides.

5. The method of claim 1 wherein forming a gate electrode including a first metal layer includes forming the first metal layer from a material selected from the group consisting of binary metals such as TaN, TiN, and WN.

6. The method of claim 5 wherein forming a gate electrode includes forming a gate electrode having a high work function.

7. The method of claim 6 wherein forming a gate electrode with a high work function includes forming a gate electrode including a second metal layer being selected from the group consisting of Pt and Pd.

8. The method of claim 5 wherein forming a gate electrode includes forming a gate electrode having a low work function.

9. The method of claim 8 wherein forming a gate electrode with a low work function includes forming a gate electrode including a second metal layer selected from the group consisting of Nb and NbO.

10. The method of claim 1 wherein forming the gate electrode work function exclusively responsive to the second metal layer includes establishing a threshold voltage (Vth).

11. The method of claim 1 wherein forming a gate electrode including a first metal layer overlying the gate insulator includes the first metal layer acting as a barrier to prevent the migration of oxygen from the gate insulator to the second metal layer.

12. In a MOSFET transistor with a reactive metal gate electrode, a method for protecting the gate electrode from an underlying gate insulator, the method comprising:

forming a gate insulator overlying a channel region;
forming a gate electrode including:
- a first metal layer, which is a barrier, overlying in the gate insulator; and,
- a second metal layer overlying the first metal layer;

wherein the gate electrode has a work function selected from a group consisting of a high work function and a low work function;

wherein the gate electrode has a high work function exclusively responsive to the second metal layer being selected from a group consisting of Ir, Re, Ni, Mn, Co, $RuO_2$, Pd, Mo, and TaSiN; and, wherein the gate electrode has a low work function exclusively responsive to the second metal layer being selected from the group consisting of Nb and NbO.

13. In a MOSFET transistor with a reactive metal gate electrode, a method for protecting the gate electrode from an underlying gate insulator, the method comprising:

forming a gate insulator overlying a channel region;
forming a gate electrode including:
- a first metal layer of WN, which is a barrier, overlying the gate insulator, having a thickness of less than 5 nanometers (nm); and,
- a second metal layer overlying the first metal layer;

wherein the gate electrode has a work function exclusively responsive to a second metal layer selected from a group consisting of Pt, Pd, Nb, and NbO.

* * * * *